United States Patent [19]
Villa et al.

[11] Patent Number: 5,756,387
[45] Date of Patent: May 26, 1998

[54] METHOD FOR FORMING ZENER DIODE WITH HIGH TIME STABILITY AND LOW NOISE

[75] Inventors: Flavio Villa, Milan; Paolo Ferrari, Gallarate, both of Italy

[73] Assignee: SGS-Thomson Microelectronics S.r.l., Agrate Brianza, Italy

[21] Appl. No.: 581,493

[22] Filed: Dec. 29, 1995

Related U.S. Application Data

[60] Provisional application No. 60/007,745 Nov. 30, 1995.

[30] Foreign Application Priority Data

Dec. 30, 1994 [EP] European Pat. Off. ............ 94830597

[51] Int. Cl.$^6$ .................................................. H01L 21/8222
[52] U.S. Cl. ........................ 438/328; 438/369; 438/358; 438/376; 438/912; 438/983; 257/469; 257/551
[58] Field of Search .......................... 257/469, 551; 438/328, 369, 356, 357, 358, 376, 912, 983

[56] References Cited

U.S. PATENT DOCUMENTS

| | | | |
|---|---|---|---|
| 4,079,402 | 3/1978 | Dunkley et al. | 357/13 |
| 4,106,048 | 8/1978 | Khajezadeh | 357/40 |
| 4,127,859 | 11/1978 | Nelson | 357/13 |
| 4,203,781 | 5/1980 | Miller | 148/1.5 |
| 4,213,806 | 7/1980 | Tsang | 148/187 |
| 4,473,941 | 10/1984 | Turi et al. | 29/578 |
| 4,683,483 | 7/1987 | Burham et al. | 357/13 |
| 4,742,021 | 5/1988 | Burham et al. | 437/149 |
| 4,870,467 | 9/1989 | Boland et al. | 257/469 |
| 5,475,245 | 12/1995 | Kudo et al. | 257/551 |
| 5,545,914 | 8/1996 | Kumano | 257/469 |

FOREIGN PATENT DOCUMENTS

| | | |
|---|---|---|
| 0159129 | 3/1985 | European Pat. Off. . |
| 0426241 | 10/1990 | European Pat. Off. . |
| 2928758 | 2/1981 | Germany . |
| 2130792 | 11/1983 | United Kingdom . |

OTHER PUBLICATIONS

Terry, L.; Pirastehfar, H.; Rutter, R., "Passivation induced voltage breakdown shifting in surface zener structures," *1990 ISTFA Proceedings*: 241–244.

Dunkley, J.; Ganschow, G.; Hannaman, D.; Patterson, J.; Willard, S.; Gopi, P., "Hot electron induced hydrogen compensation of boron doped silicon resulting from emitter--base breakdown," *1992 IEDM Technical Digest*: 785–788.

*Primary Examiner*—David Graybill
*Assistant Examiner*—Long Pham
*Attorney, Agent, or Firm*—David V. Carlson; John C. Stewart; Seed and Berry LLP

[57] ABSTRACT

Zener diode with high stability in time and low noise for integrated circuits and provided in an epitaxial pocket insulated from the rest of a type N epitaxial layer grown on a substrate of type P semiconductor material.

In said pocket are included a type N+ cathode region and a type P anode region enclosing it.

The cathode region has a peripheral part surrounding a central part extending in the anode region less deeply than the peripheral part.

11 Claims, 5 Drawing Sheets

$BV_1 < BV_2$

METHOD FOR FORMING ZENER DIODE WITH HIGH TIME STABILITY AND LOW NOISE

CROSS-REFERENCE TO RELATED APPLICATION

This application claims priority under 35 USC 119(e)(1) of provisional application number 60/007,745 filed Nov. 30, 1995.

This application claims priority from EPC App'n 94830597.4, filed Dec. 30, 1994, which is hereby incorporated by reference. However, the content of the present application is not necessarily identical to that of the priority application.

BACKGROUND AND SUMMARY OF THE INVENTION

The present invention relates to a Zener diode for integrated circuits and specifically to those known to those skilled in the art as "buried Zener".

In integrated circuits Zener diodes are amply used as a voltage reference and for this use an indispensable characteristic is long term stability together with limited thermal drift and low noise level.

In accordance with the known techniques Zener diodes can be implemented in accordance with two main configurations as shown in FIGS. 1 and 2 of the annexed drawings. In said figures are indicated respectively the "surface Zener" configuration so-called because in it the breakdown of the bipolar junction in reverse polarization takes place essentially near the surface of the semiconductor chip where the junction curvature is greater and the "buried Zener" configuration so-called because it is capable of confining the breakdown mechanism of the bipolar junction to below the device surface.

Zener surface diodes show in the long term poor stability due to ion contamination, typically sodium, present in the device oxides modifying the width of the depletion junction region and due to neutralization of the dopant ions of the type P regions due to hydrogen ions (formation e.g. of B—H bonds) deriving from nitride layers used for device passivation.

They also exhibit not negligible thermal drift and high noise levels.

The above problems are discussed for example in the following articles, both of which are hereby incorporated by reference: L. Terry, H. Pirastehfar, and R. Rutter, "Passivation Induced Voltage Breakdown Shifting in Surface Zener Structure", 1990 ISTFA Proceedings pages 241–244; J. Dunkley et al., "Hot Electron Induced Hydrogen Compensation of Boron Doped Silicon Resulting from Emitter-Base Breakdown", 1992 IEDM Technical Digest.

As appears from both the figures, the Zener diodes are provided in general by reverse biasing of the base-emitter junction of a vertical NPN transistor.

In the typical buried Zener diode structure as shown in FIG. 2 there is noted a deep P+ diffusion indicated in the technical literature as "P+ plug" which is in addition to the usual integration process steps and provided before the base P and emitter N+ diffusion which are anode and cathode regions respectively.

The N+ emitter region completely covers the P+ diffusion.

The base-emitter breakdown mechanism which the Zener diode provides takes place in two steps.

First the breakdown takes place in the zone of greater dopant concentration, i.e. at the intersection between the N+ and P+ zones inside the structure.

After this first breakdown at a voltage BV1 there follows a second at a higher voltage BV2 which involves the N+P junction.

The current in the Zener is fixed in such a manner that the Zener voltage Vz is between BV1 and BV2, i.e.:

$$BV1 < Vz < BV2.$$

As concerns thermal drift of Vz we can observe that it can be reduced or annulled by acting on the P+ zone doping. This occurs for doping concentrations of the P+ zone corresponding to breakdown voltages around 5 V.

Indeed, for voltages less than 5 V the breakdown phenomenon is due to electron tunnelling and the electrical field generated by the voltage applied, even though low, breaks the covalent bonds between the silicon atoms nearby to obtain electrons and conduction holes predominates.

This phenomenon is favored by temperature increases and causes the resulting voltage coefficient to be negative with decrease of the voltage necessary to start the breakdown phenomenon with increasing temperature.

For voltages greater than 5 V avalanche multiplication—or impact ionization—predominates. In this phenomenon if the electrical field present is sufficiently high the electron and the hole thermally generated can reach, before undergoing collision with the crystalline grid, a kinetic energy level sufficient to break the silicon-silicon bonds and give rise to formation of other electron-hole pairs until it originates an avalanche phenomenon.

For voltages around 5 V the two different phenomena cause jointly a compensation of the effects so that the thermal coefficient of Vz is virtually null.

As concerns noise due to the avalanche process, which shows a wide spectrum from 100 Hz to 100 Mhz, it can be progressively reduced by increasing the dopant concentration of the P+ zone. A good compromise between current loss or leakage of the junction and reduced noise is assured with Zener diode structures whose breakdown voltage is around 5 V. For buried Zener diode structures there are obtained noise values of the avalanche type of 400 nV/√Hz for a current Iz=10 mA. With the same structures for higher breakdown voltages, e.g. around 6 V and 10 V, there are observed noise voltages Vn of 1.25 µV/√Hz and 37 µV/√Hz respectively.

Structures of the type shown in FIG. 2 display non-negligible noise levels of the so-called "burst" and "microplasma" types because of the crystallographic defects induced by the high dopant concentration of the P+ layer.

In integrated circuits there is sometimes a need to insert Zener diodes at critical points as concerns noise performance. In some applications, e.g. D/A converters, reference voltage fluctuations must be less than the level transactions of the least significant bit, otherwise the conversion would be distorted.

In such cases it is basically important to have available structures capable of ensuring reduced noise levels together with null thermal drift and high long-term stability.

The technical problem underlying the present invention is to provide a Zener diode for integrated circuit devices which, in comparison with known buried Zener diodes, would have a lower noise level.

The problem is solved by a Zener diode of the type indicated below and defined in the characterizing part of the claims following this description.

DETAILED DESCRIPTION OF THE PREFERRED EMBODIMENTS

The characteristics and advantages of the Zener diode in accordance with the present invention are set forth in the description of an embodiment thereof given below by way of non-limiting example with reference to the annexed drawings.

Figure 1:
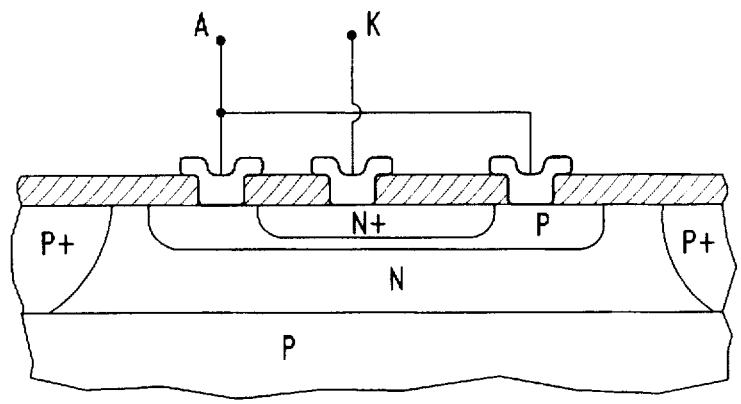
FIGS. 1 and 2 show cross sections of two different known types of Zener diode structures.
Figure 2:
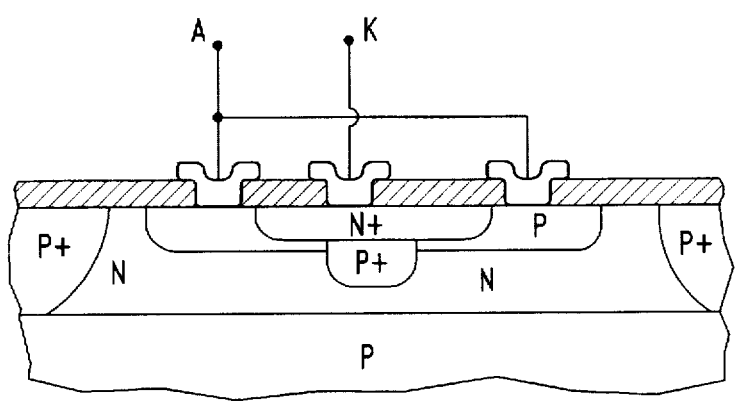
Figure 3:
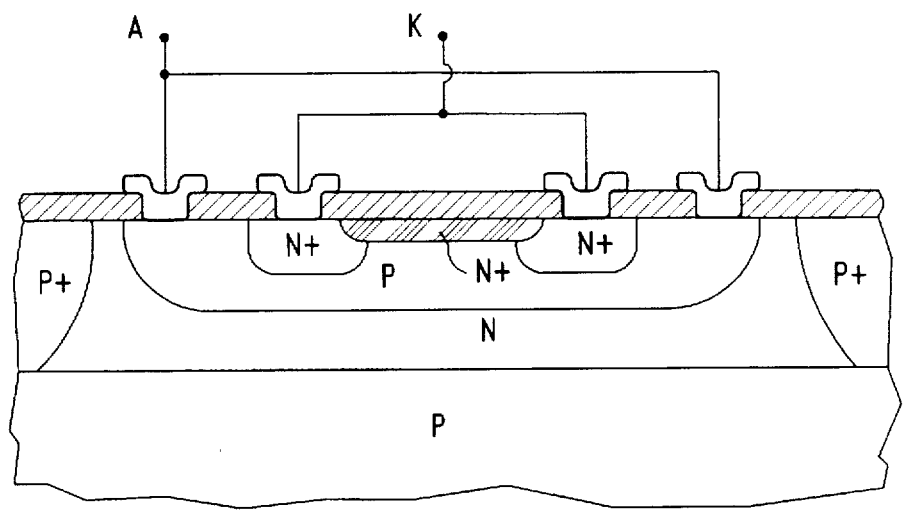
FIGS. 3 and 4 show respectively a cross section and a plan view of a Zener diode structure in accordance with the present invention.
Figure 4:
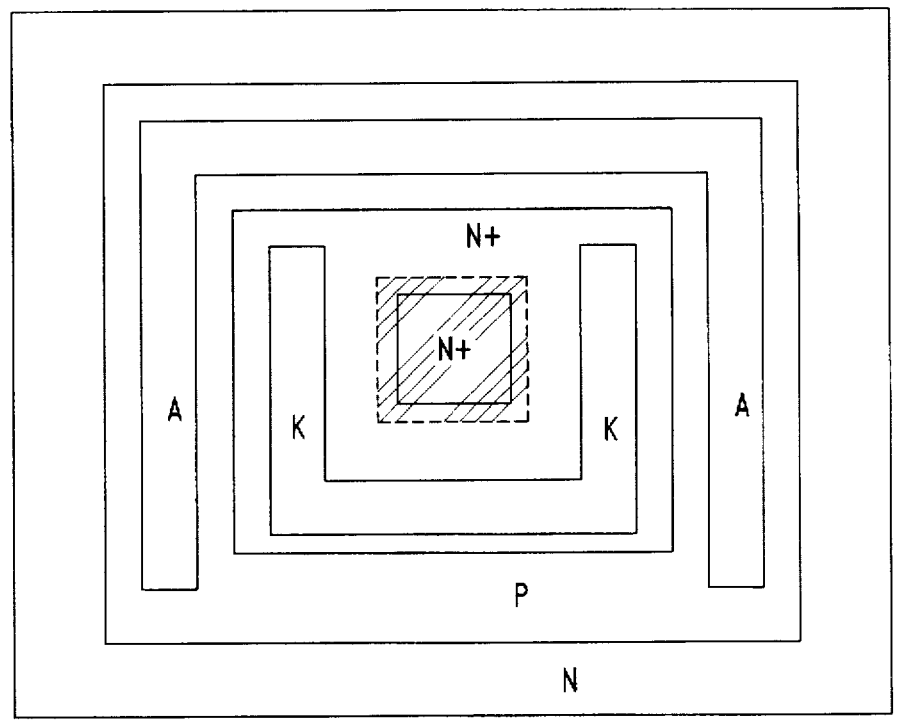

FIG. 3 of the drawings shows a cross section of the structure of a Zener diode in accordance with the present invention, while FIG. 4 shows a possible topography of an implementation thereof within an integrated circuit.

Note that the illustrated diode is of the "buried Zener" diode type, but with better characteristics than the known ones.

Differently from those, a Zener diode in accordance with the present invention does not exhibit a deep P+ central diffusion while its essential characteristic is a shallower central zone in the N+ cathode region whose contacts are open in its deeper peripheral zone.

In a normal bipolar process the P anode region is provided by the same masking and diffusion operations used for constructing the base region of an NPN transistor while the N+ cathode region is provided in accordance with the present invention in two separate process steps.

In a first phase the deeper peripheral part shaped in a ring of the N+ cathode region is provided by the same masking and diffusion operations used to make the emitter region of an NPN transistor.

Subsequently, by using an additional masking operation and an ion implantation of pentavalent atoms (such as As, P, or Sb), there is provided in the internal zone of the ring a part of the N+ cathode region thinner, i.e. shallower, than the peripheral zone.

In practice, instead of increasing the dopant concentration in a central zone of the P+ layer as in the conventional "buried" Zener diodes, the depth of the N+ layer is reduced in the same zone.

The concentration of the P region at the metallurgical junction in said zone is automatically increased and the breakdown voltage correspondingly reduced.

Therefore even in a Zener diode in accordance with the present invention the first breakdown of the bipolar junction takes place as in the known "buried" type in a "buried" zone and not at the surface.

The new structure thus exhibits all the advantages indicated above for the "buried" Zener diodes but at the same time exhibits greatly reduced "microplasma" and "burst" noise levels thanks to the fact that the P anode region is on the whole much less doped.

In conclusion, besides the advantage of nearly null thermal drift and the excellent compromise achievable between the leakage current of the junction and "avalanche" noise reduction around the breakdown voltage of only 5 V and besides the high long-term stability, the new Zener diode structure has better microplasma and burst noise reduction thanks to the lesser doping of the P anode region.

The total peak-to-peak noise is drastically reduced which is extremely advantageous as mentioned in certain applications.

It is also interesting to note that while the known buried Zener diodes are provided by integration processes calling generally for growth of an epitaxial layer of type N semiconductor material on a substrate of type P semiconductor material and insulation with P+ zones of epitaxial pockets N in which are provided diodes and transistors, a Zener diode in accordance with the present invention can be provided directly on a type P substrate which thus acts as an anode.

Figure 5:
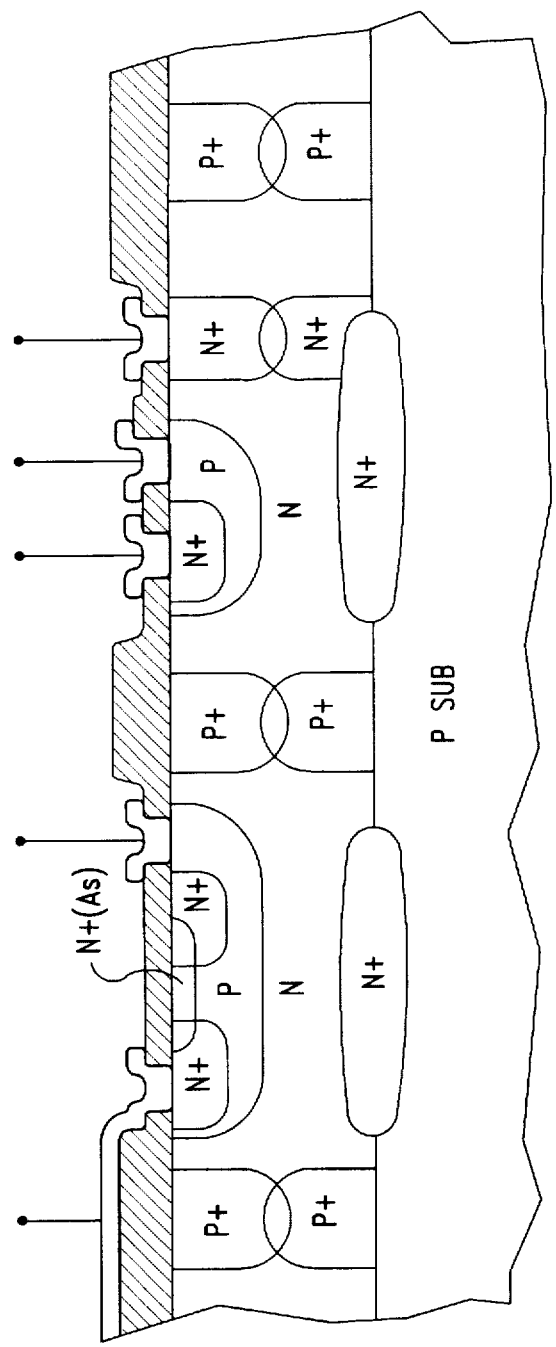
FIG. 5 shows an innovative Zener diode side-by-side with a bipolar transistor made in the same process.

FIG. 5 shows an innovative Zener diode side-by-side with a bipolar transistor made in the same process. As this diagram shows, there are useful synergies between the diode and the transistor:

the deeper part of the diode's cathode diffusion uses the emitter diffusion;

the shallower part of the diode's cathode diffusion uses a contact diffusion;

the diode's anode diffusion uses the base diffusion.

As this illustration shows, the diode is preferably totally surrounded by p+ reach-up diffusions.

Figure 6A:
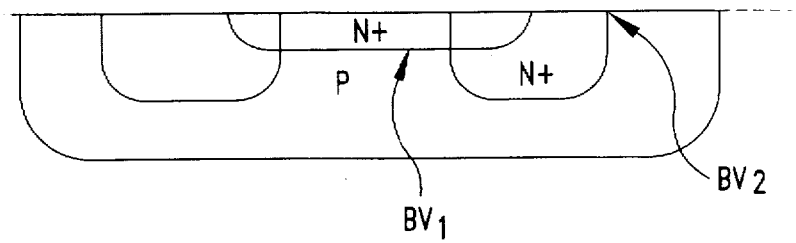
FIG. 6A shows how different regions of the innovative Zener diode determine different breakdown voltages.
Figure 6B:
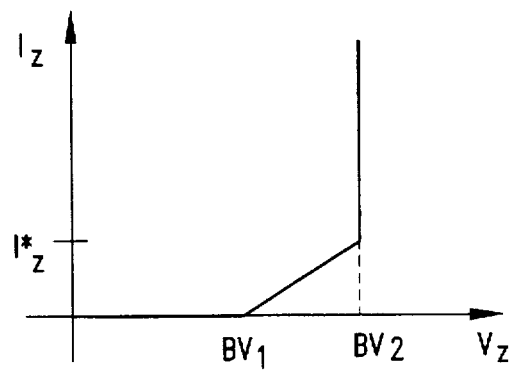
FIG. 6B shows the resulting I–V relations.

FIG. 6A shows how different regions of the innovative Zener diode determine different breakdown voltages, and FIG. 6B shows the resulting I–V relations.

Figure 7:
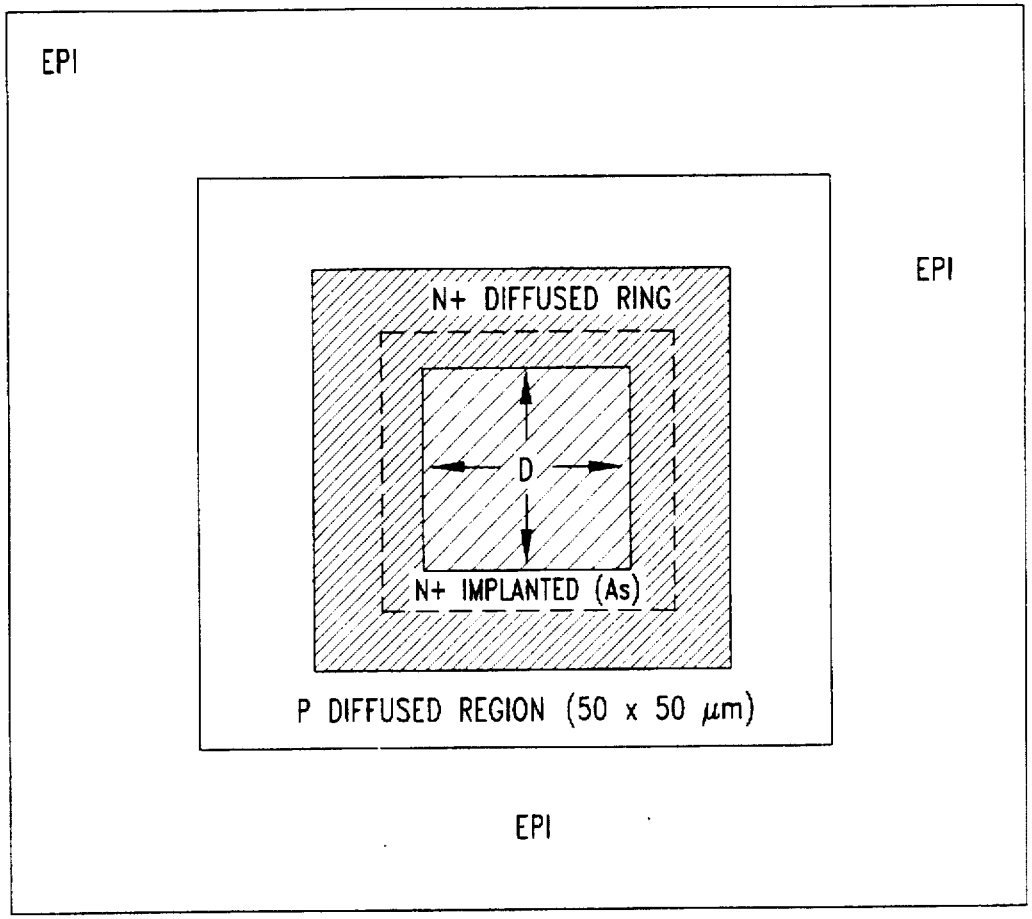
FIG. 7 is a simple plan view of the diode, which is used to describe sample dimensions.

FIG. 7 is a simple plan view of the diode, which is used to describe sample dimensions. In this sample embodiment, the boundary of the boron-doped isolation region has dimensions of 80×80 µm, and the central diode area D has dimensions of 5×5 µm. Other parameters, in the presently preferred embodiment, are:

the P region has a sheet resistance of about 100 Ω/□;

the n+ diffused region has a sheet resistance in the range of 2–10 Ω/□;

the n+ implanted region (As-doped) has a sheet resistance in the range of about 30 Ω/□;

the thickness of the epitaxial layer is typically in the range of 6–30 µm; and the resistivity of the epitaxial layer is typically in the range of 1–30 Ω-cm.

However, of course these dimensions and parameters can readily be varied, as will readily be understood by those of ordinary skill.

It is clear that modification, integration and replacement of elements can be made to the embodiment described above by way of nonlimiting example without thereby going beyond the protective scope of the following claims.

For example, the semiconductor substrate could be type N and thus the polarities of the different regions would be appropriately varied.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown. For another example, references to "Zener" diodes in the foregoing text may apply not only to diodes which use the Zener effect, but also to avalanche breakdown diodes generally.

What is claimed is:

1. Fabrication procedure for an integrated circuit device comprising the following operations:

growth of at least one epitaxial semiconductor layer doped with impurities of a first type on a semiconductor substrate doped with impurities of a second type, insulation of at least a part of said epitaxial layer by means of an insulation zone doped with impurities of the second type extending from the surface of the epitaxial layer to the substrate, creation of a region extending on the surface of the layer and doped with impurities of the second type in said at least one insulated epitaxial layer part by diffusion therein of impurities, and creation of a region doped with impurities of the first type extending from the surface of the epitaxial layer in the region doped with impurities of the second type by diffusion therein of impurities to a first depth to create a peripheral zone of said region doped with impurities of the first type and by ion implantation of impurities to create at least one zone of said region doped with impurities of the first type surrounded by said peripheral zone with implantation energy for implantation of the impurities to a second depth less than the first.

2. The fabrication procedure of claim 1, further comprising formation of electrode contacts to the peripheral zone at the surface of the epitaxial layer and to the region doped with impurities of the second type at the surface of the epitaxial layer.

3. The fabrication procedure of claim 1, further comprising creation of a base diffusion region of a bipolar transistor in another insulated epitaxial layer part simultaneously with the creation of the region doped with impurities of the second type.

4. The fabrication procedure of claim 1, further comprising creation of an emitter diffusion region of a bipolar transistor in another insulated epitaxial layer part simultaneously with the creation of the peripheral zone.

5. In a semiconductor integrated circuit having a transistor and a diode, the transistor including base, collector and emitter semiconductor regions, and the diode including anode and cathode semiconductor regions, a method of fabricating the integrated circuit, comprising the steps of:

forming an epitaxial layer of a first conductivity type on a semiconductor substrate of a second conductivity type;

forming a first one of the anode and cathode regions of the second conductivity type within a surface portion of the epitaxial layer, and simultaneously forming a first one of the base, collector and emitter regions of the second conductivity type within the surface portion of the epitaxial layer;

forming a peripheral portion of a second one of the anode and cathode regions of the first conductivity type within the first one of the anode and cathode regions;

forming an interior portion of the second one of the anode and cathode regions of the first conductivity type within the first one of the anode and cathode regions, the interior portion being laterally enclosed by the peripheral portion and shallower than the peripheral portion; and forming electrode contacts with the anode and cathode regions at positions proximate to the surface of the epitaxial layer.

6. The method of claim 5 wherein the step of forming a first one of the base, collector and emitter regions includes the step of forming the base region.

7. The method of claim 6 wherein the step of forming a first one of the anode and cathode regions includes the step of forming the anode region.

8. The method of claim 5 wherein the step of forming a peripheral portion of the second one of the anode and cathode regions is performed simultaneously with a step forming a second one of the base, collector and emitter regions of the first conductivity type within the surface portion of the epitaxial layer.

9. The method of claim 8 wherein the step of forming a second one of the base, collector and emitter regions includes the step of forming the emitter region.

10. The method of claim 9 wherein the step of forming a peripheral portion of a second one of the anode and cathode regions includes the step of forming a peripheral portion of the cathode region.

11. The method of claim 5 wherein the step of forming an interior portion of the second one of the anode and cathode regions is performed simultaneously with a step forming an electrode contact region in one of the anode, cathode, base, collector, and emitter regions.

* * * * *